(12) United States Patent
Liu et al.

(10) Patent No.: US 10,594,290 B2
(45) Date of Patent: Mar. 17, 2020

(54) PLANAR BALUN AND MULTI-LAYER CIRCUIT BOARD

(71) Applicant: General Electric Company, Schenectady, NY (US)

(72) Inventors: Yu Liu, Beijing (CN); Dongliang Yang, Beijing (CN); Xin Xie, Beijing (CN); Haoyang Xing, Beijing (CN); Kai Wang, Beijing (CN); Chunlai Xiao, Beijing (CN)

(73) Assignee: General Electric Company, Schenectady, NY (US)

( * ) Notice: Subject to any disclaimer, the term of this patent is extended or adjusted under 35 U.S.C. 154(b) by 40 days.

(21) Appl. No.: 15/851,037

(22) Filed: Dec. 21, 2017

(65) Prior Publication Data

US 2018/0191326 A1 Jul. 5, 2018

(30) Foreign Application Priority Data

Dec. 30, 2016 (CN) .......................... 2016 1 1269648

(51) Int. Cl.
*H03H 7/42* (2006.01)
*H01P 5/10* (2006.01)
(Continued)

(52) U.S. Cl.
CPC ........... *H03H 7/42* (2013.01); *H01F 17/0013* (2013.01); *H01F 17/0033* (2013.01);
(Continued)

(58) Field of Classification Search
CPC .................................. H03H 7/42; H01P 5/10
(Continued)

(56) References Cited

U.S. PATENT DOCUMENTS

| | | | | |
|---|---|---|---|---|
| 5,451,914 A | * | 9/1995 | Stengel | ............... H01F 17/0006 333/25 |
| 5,917,386 A | * | 6/1999 | Dobrovolny | ........ H01F 17/0006 333/119 |

(Continued)

FOREIGN PATENT DOCUMENTS

| CN | 202135098 U | * | 1/2012 |
|---|---|---|---|
| CN | 202135098 U | | 2/2012 |

OTHER PUBLICATIONS

Jafari et al., A Wideband Compact Planar Balun for UHF DTV Applications, 2009, Journal of Electromagnetic Waves and Applications, vol. 23, 8 pages. (Year: 2009).*

*Primary Examiner* — Dean O Takaoka

(57) ABSTRACT

The present invention provides a planar balun and a multi-layer circuit board. The planar balun formed on the multi-layer circuit board comprises: a first winding with at least one turn, which is formed in a first conductive layer, and has a first lead and a second lead serving as a first balanced end and a second balanced end of the balun respectively; a second winding with at least one turn, which is formed in a second conductive layer separated from the first conductive layer by at least a first insulating layer, and has a third lead and a fourth lead, wherein the third lead is connected to a ground potential, and the fourth lead serves as an unbalanced end of the balun; and a first balancing capacitor, which is connected between a selected portion near a center of the first winding and the ground potential.

13 Claims, 9 Drawing Sheets

(51) Int. Cl.
*H01F 27/28* (2006.01)
*H01F 17/00* (2006.01)
H01F 27/40 (2006.01)
H01F 27/29 (2006.01)

(52) U.S. Cl.
CPC ......... *H01F 27/2804* (2013.01); *H01F 27/29* (2013.01); *H01F 27/40* (2013.01); *H01F 2027/2809* (2013.01)

(58) Field of Classification Search
USPC .......................................................... 333/25
See application file for complete search history.

(56) References Cited

U.S. PATENT DOCUMENTS

| | | | |
|---|---|---|---|
| 6,917,254 B2* | 7/2005 | Kaehs | H01F 27/2804 333/246 |
| 7,656,247 B2* | 2/2010 | Kaehs | H01P 5/10 333/238 |
| 7,902,939 B2* | 3/2011 | Blair | H01P 5/10 333/26 |
| 8,618,802 B2 | 12/2013 | Albrecht et al. | |
| 2008/0024241 A1* | 1/2008 | Hata | H01P 5/10 333/26 |
| 2015/0042340 A1 | 2/2015 | Zeng et al. | |

\* cited by examiner

US 10,594,290 B2

PLANAR BALUN AND MULTI-LAYER CIRCUIT BOARD

CROSS-REFERENCE TO RELATED APPLICATION

This application claims priority to Chinese Patent Application No. 201611269648.4, filed on Dec. 30, 2016, the entirety of which is incorporated herein by reference.

BACKGROUND

The present invention relates to the technical field of radio frequency circuits, and in particular to a planar balun and a multi-layer circuit board on which the planar balun is formed.

In a radio frequency power amplifier, a push-pull circuit may generally be used, such as a power amplifier in which two transistors operate in a push-pull manner. In the push-pull circuit, a balun (balanced-unbalanced converter) is an essential component. For example, it can convert, at an input stage, a signal on an unbalanced transmission line into two balanced inputs with the same power but opposite phases to provide to the transistors of the power amplifier, and convert, at an output stage, two balanced outputs of the power amplifier into an unbalanced (single end) output in an opposite manner so as to provide the unbalanced output to an unbalanced load.

FIG. 1 is a schematic circuit diagram of a typical push-pull circuit. In the circuit, an input balun 1 converts a signal on an unbalanced transmission line into a balanced input of a power amplifier, and an output balun 2 converts a balanced output of the power amplifier onto an unbalanced load. Each balun in FIG. 1 is composed of two inductors, wherein the ends of one inductor serve as balanced ends of the balun and are connected to a matching network, while one end of the other inductor is grounded and the other end of the other inductor serves as an unbalanced end of the balun. By virtue of the coupling effect between the two inductors of the balun, a differential signal input from the balanced ends can be converted into a single end signal of the unbalanced end, and vice versa.

As an example, FIG. 1 also shows optional resonating capacitors respectively connected to the two inductors of each balun in parallel. By appropriately selecting the induction values of the inductors and the capacitance values of the resonating capacitors of the balun, the operational frequency of the balun can be regulated. Note that the resonating capacitors in FIG. 1 are optional elements, and if the values of the inductors are large enough, or a ¼ wavelength transmission line or a magnetic core type of inductors are used to implement the balun, the resonating capacitors can be omitted.

In the circuit in FIG. 1, a relevant circuit to provide a direct current power supply for transistors of the power amplifier is also shown. As shown in FIG. 1, gate-source voltages Vgs1 and Vgs2 can be respectively applied to gates of the two transistors via choke inductors and decoupling capacitors, and drain voltages Vdd1 and Vdd2 can be respectively applied to drains of the two transistors via choke inductors and decoupling capacitors.

Depending on different operational frequencies, the balun, such as the one shown in FIG. 1, can be implemented in different ways. For S band and above, the balun can be easily implemented with a ¼ wavelength transmission line. With regard to UHF (300 MHz to 3000 MHz), VHF (30 MHz to 300 MHz) and lower bands, as it is limited by the size and extremely high power, generally a ferrite material is used to implement the balun, since it has a higher magnetic flux density.

In a push-pull amplifier of an MR (magnetic resonance) detection system, due to a low operational frequency (tens to hundreds MHz) and high power, a balun made of ferrite material is generally used. However, since the ferrite material may form magnetic saturation, which results in that such structure cannot be used in a strong magnetic environment of a scan room of the MR detection system, it must be placed outside the scan room and connected to the MR detection system via cable. This results in a high transmission loss, and also goes against to system integration.

To this end, there is a need for a balun which is suitable to be used in strong magnetic field environment, such as a scan room of an MR detection system.

SUMMARY

One exemplary embodiment of the present invention provides a planar balun formed on a multi-layer circuit board, the balun comprising: a first winding with at least one turn, which is formed in a first conductive layer, and has a first lead and a second lead serving as a first balanced end and a second balanced end of the balun respectively; a second winding with at least one turn, which is formed in a second conductive layer separated from the first conductive layer by at least a first insulating layer, and has a third lead and a fourth lead, wherein the third lead is connected to a ground potential, and the fourth lead serves as an unbalanced end of the balun; and a first balancing capacitor, which is connected between a selected portion near a center of the first winding and the ground potential.

Another exemplary embodiment of the present invention provides a multi-layer circuit board, on which the planar balun as mentioned above is formed.

The planar balun and multi-layer circuit board in the embodiments of the present invention are suitable for use in a strong magnetic field environment such as a scan room of an MR detection system, and can have an improved balance.

Other features and aspects will be apparent through the following detailed description, figures and claims.

BRIEF DESCRIPTION OF THE DRAWINGS

The present invention will be better understood in light of the description of the exemplary embodiments of the present invention with reference to the accompanying drawings. In the drawings, the same or similar drawing reference represents the same or similar components, in which.

DETAILED DESCRIPTION

Figure 1:
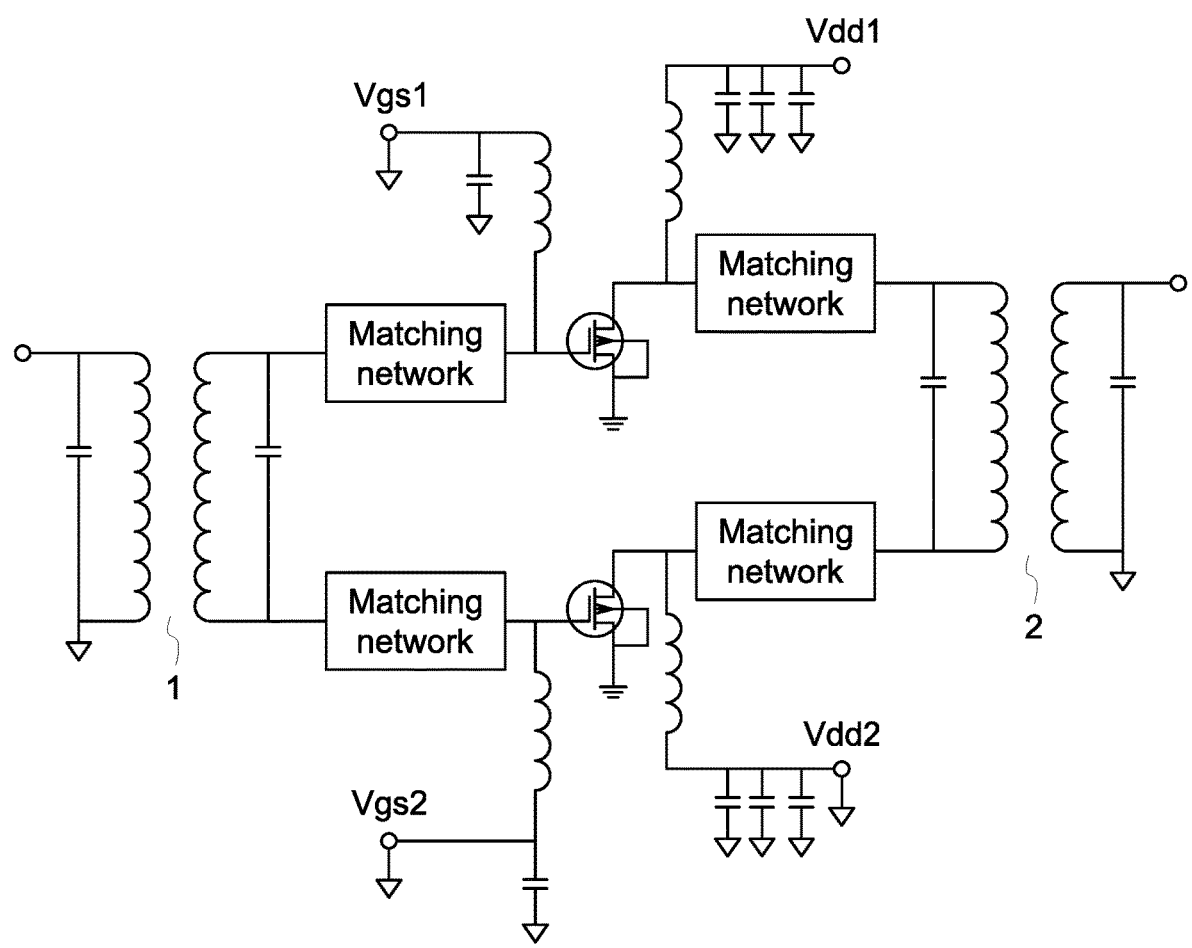
FIG. 1 is a schematic diagram of a circuit principle of a typical push-pull circuit.

Hereafter, a detailed description will be given for preferred embodiments of the present disclosure. It should be pointed out that in the detailed description of the embodiments, for simplicity and conciseness, it is impossible for the description to describe all the features of the practical embodiments in details. It should be understood that in the process of a practical implementation of any embodiment, just as in the process of an engineering project or a designing project, in order to achieve a specific goal of the developer and in order to satisfy some system-related or business-related constraints, a variety of decisions will usually be made, which will also be varied from one embodiment to another. In addition, it can also be understood that although the effort made in such developing process may be complex and time-consuming, some variations such as design, manufacture and production on the basis of the technical contents disclosed in the disclosure are just customary technical means in the art for one of ordinary skilled in the art associated with the contents disclosed in the present disclosure, which should not be regarded as insufficient disclosure of the present disclosure.

Unless defined otherwise, all the technical or scientific terms used in the claims and the description should have the same meanings as commonly understood by one of ordinary skilled in the art to which the present disclosure belongs. The terms "first", "second" and the like in the description and the claims of the present utility model do not mean any sequential order, number or importance, but are only used for distinguishing different components. The terms "a", "an" and the like do not denote a limitation of quantity, but denote the existence of at least one. The terms "comprises", "comprising", "includes", "including" and the like mean that the element or object in front of the "comprises", "comprising", "includes" and "including" covers the elements or objects and their equivalents illustrated following the "comprises", "comprising", "includes" and "including", but do not exclude other elements or objects. The term "coupled" or "connected" or the like is not limited to being connected physically or mechanically, nor limited to being connected directly or indirectly.

According to an embodiment of one aspect of the present invention, a planar balun is provided. The balun of this embodiment is formed on a multi-layer circuit board, comprising a first winding with at least one turn, which is formed in a first conductive layer, and has a first lead and a second lead serving as a first balanced end and a second balanced end of the balun respectively; a second winding with at least one turn, which is formed in a second conductive layer separated from the first conductive layer by at least a first insulating layer, and has a third lead and a fourth lead, wherein the third lead is connected to a ground potential, and the fourth lead serves as an unbalanced end of the balun; and a first balancing capacitor, which is connected between a selected portion near the center of the first winding and the ground potential.

Figure 2:
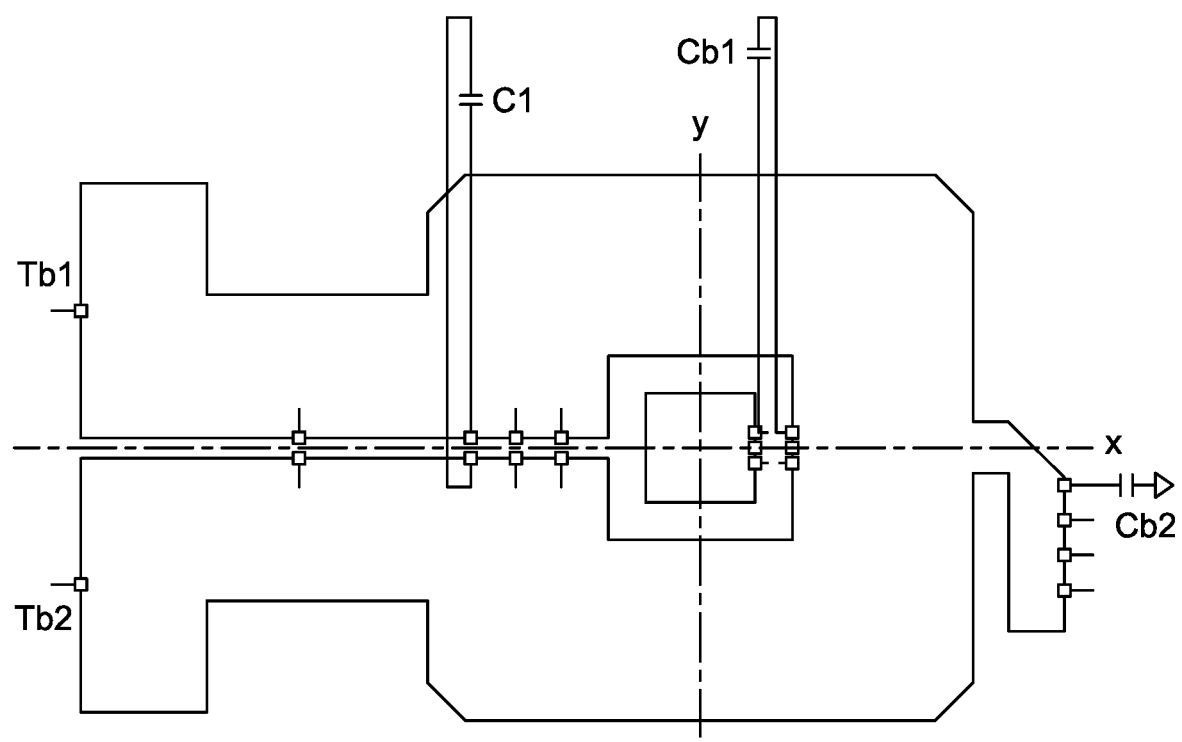
FIG. 2 is a planar schematic diagram of a first winding and relevant components of a balun in an embodiment of the present invention.
Figure 3:
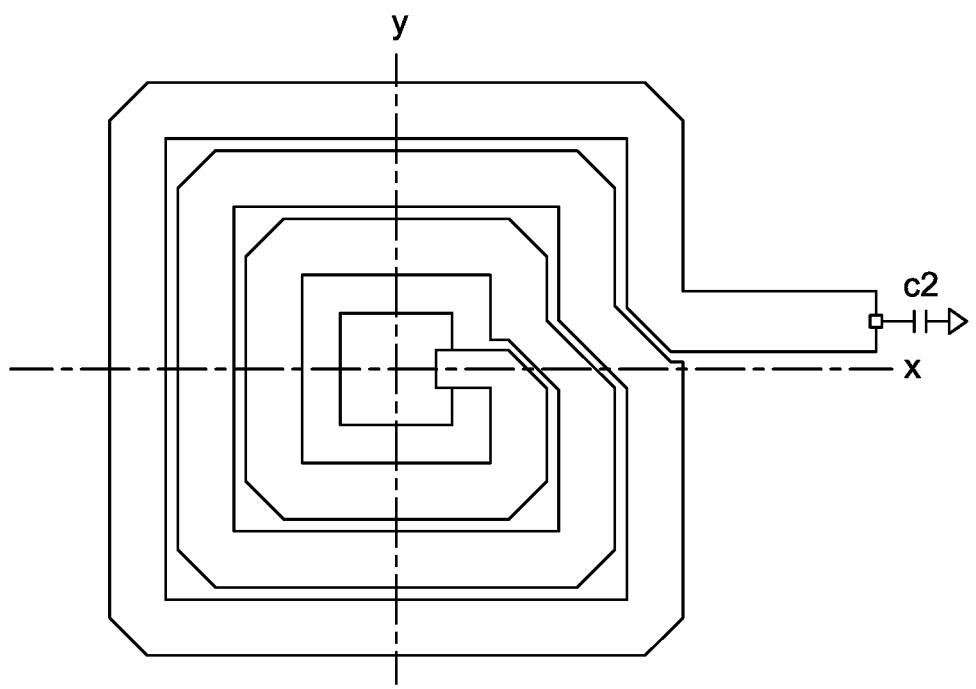
FIG. 3 is a planar schematic diagram of a second winding and relevant components of a balun in an embodiment of the present invention.

FIGS. 2 and 3 schematically show an exemplary structure of the balun of this embodiment, wherein FIG. 2 shows a planar schematic diagram of a first winding and relevant components, and FIG. 3 shows a planar schematic diagram of a second winding and relevant components.

FIG. 2 shows a first winding formed in a first conductive layer, which is a single-turn winding in this example. The winding has a first lead and a second lead respectively serving as a first balanced end Tb1 and a second balanced end Tb2 of the balun. As an example, in a blank portion of the layout center of the first winding, a grounding welding pad is formed to ground a desired component in the first conductive layer. As shown in FIG. 2, a first balancing capacitor Cb1 is connected between a selected portion near the center of the first winding and the grounding welding pad (i.e., a ground potential). By utilizing the balancing capacitor Cb1, a virtual ground can be provided at a selected position of the first winding L1 to set a proportion of which the first winding L1 is divided into two portions, so as to improve the unbalance between the two balanced ends Tb1 and Tb2.

Preferably, in the example in FIG. 2, the first balancing capacitor Cb1 is connected between a selected portion near an inner center of the first winding which serves as a single-turn winding and the ground potential. In addition, optionally, as shown in FIG. 2, there is a center tap at an outer center of the single-turn winding, the center tap being connected to the ground potential via a second balancing capacitor Cb2. Since the wiring of the winding with a planar layout has a certain width, it results in that the actual potentials of the corresponding positions of the inner side and the outer side of the winding are not necessarily consistent. Therefore, the center tap at the outer side of the winding is connected to the ground potential via the second balancing capacitor Cb2, which facilitates further improving the balance of the balun.

FIG. 3 shows a planar schematic diagram of a second winding formed in a second conductive layer. The second conductive layer should be separated from the first conductive layer by at least a first insulating layer. As an example, FIG. 3 shows a second winding with three turns, and a grounding welding pad is formed in a blank portion of the layout center of the second winding, so as to ground a desired component in the second conductive layer. The second winding has a third lead and a fourth lead, wherein the third lead is connected to a ground potential, and the fourth lead serves as an unbalanced end Tun of the balun. In this example, a terminal of the innermost turn of the second winding, serving as the third lead wire, is connected to the grounding welding pad (ground potential), and a terminal of the outermost turn serves as the fourth lead or the unbalanced end Tun of the balun.

Those skilled in the art will appreciate that, although FIG. 3 shows a second winding with three turns, the second winding may have other number of turns, such as a single turn, two turns or four turns. Accordingly, when the balanced end of the balun serves as an input and the unbalanced end of the balun serves as an output, in addition to the impedance transformation ratio of 1:9, the balun may also have other impedance transformation ratios, such as 1:1, 1:4 or 1:16.

The number of turns of the second winding may be determined according to application requirements and various design factors. For example, a desired impedance transformation ratio may be achieved by reasonably setting the number of turns of the winding. When the balun with a desired impedance transformation ratio serves as, for example, the input balun and/or output balun in the push-pull circuit in FIG. 1, the matching network in the figure may be omitted, thereby simplifying the circuit structure.

In addition, those skilled in the art will appreciate that, although FIGS. 2 and 3 and subsequent figures show a square-shaped first winding and second winding, such winding shapes are merely examples, and the shapes of windings may use other appropriate shapes, such as a circle.

The first winding and second winding may be formed in, for example, a conductive layer (such as a copper layer) of a PCB substrate by using an approach such as etching. Those skilled in the art will appreciate that any appropriate method or process in the prior art may be used to form the first winding and the second winding, and this is not described in detail herein.

In order to enable the balun to operate at a desired frequency, in this example, as shown in FIGS. 2 and 3, a first tuning capacitor C1 is also connected between the first lead and the second lead, and a second tuning capacitor C2 is connected between the fourth lead and the ground potential. By reasonably setting parameters such as the lengths, widths and intervals between turns of the windings L1 and L2 and the capacitance values of the capacitors C1 and C2, the resonance frequency of two sides of the transformer balun may be set to enable the balun to operate at a desired frequency. Note that multiple pairs of candidate positions between the first lead and the second lead are shown in FIG. 2 for the connection to the first tuning capacitor C1. An appropriate position may be chosen for the connection to the tuning capacitor C1 according to circuit test and optimization results, which is not described in detail herein.

In order to improve the balance of the balun, preferably, the first winding and the second winding are respectively formed as a substantially symmetrical pattern or layout. FIGS. 2 and 3 and subsequent FIGS. 5, 7 to 9 all show x and y coordinate axes to schematically show the symmetry of the layouts of the first winding and the second winding, which is not described in detail herein.

By reasonably designing the wiring patterns (such as the wiring length, width, intervals between turns) of the first winding and the second winding, the balun can operate at different operational frequencies when different capacitance values are chosen for the tuning capacitors C1 and C2. That is, on the premise of not changing the wiring pattern, the balun can operate in different operational frequencies by only choosing tuning capacitors C1 and C2 with different capacitance values. For example, with regard to different applications of 1.5 T (Tesla) and 3 T in an MR detection system, the balun in this embodiment may respectively operate around 63.86 MHz and 127.72 MHz (or 128 MHz) by choosing tuning capacitors C1 and C2 with different capacitance values. Such balun facilitates mass production and improves the production efficiency.

In a preferred embodiment, a plurality of candidate portions may be provided near the center of the first winding, for example, FIG. 2 shows the positions of candidate portions near an inner center of the first winding. Due to the insertion loss of the balun and the fact that the balance changes with the change of the operational frequency, the selected portion to be connected to the ground potential via the first balancing capacitor Cb1 can be determined from these candidate portions according to the operational frequency of the balun. As an example, FIG. 2 shows that the first balancing capacitor Cb1 is connected between an upper candidate position of the center of the first winding and the corresponding position of the grounding welding pad. With the change of the operational frequency, the first balancing capacitor Cb1 can be connected between a central or lower candidate position and the corresponding position of the grounding welding pad. In this way, at different operational frequencies, the position of the virtual ground of the first winding L1 can be changed according to test or optimization results, thus changing the proportion of which the first winding L1 is divided into two portions, thereby the amplitude and/or phase unbalanced between the two balanced ends Tb1 and Tb2 is improved. The specific positions of various candidate portions can be reasonably determined by designing in advance.

Similarly, FIG. 2 also shows a plurality of candidate positions of an outer center tap of the first winding, and shows that the second balancing capacitor Cb2 is connected to the ground potential at the uppermost candidate position. Optionally, with the change of the operational frequency, the second balancing capacitor Cb2 can be connected between one of the other three candidate positions and the ground potential.

Figure 4:
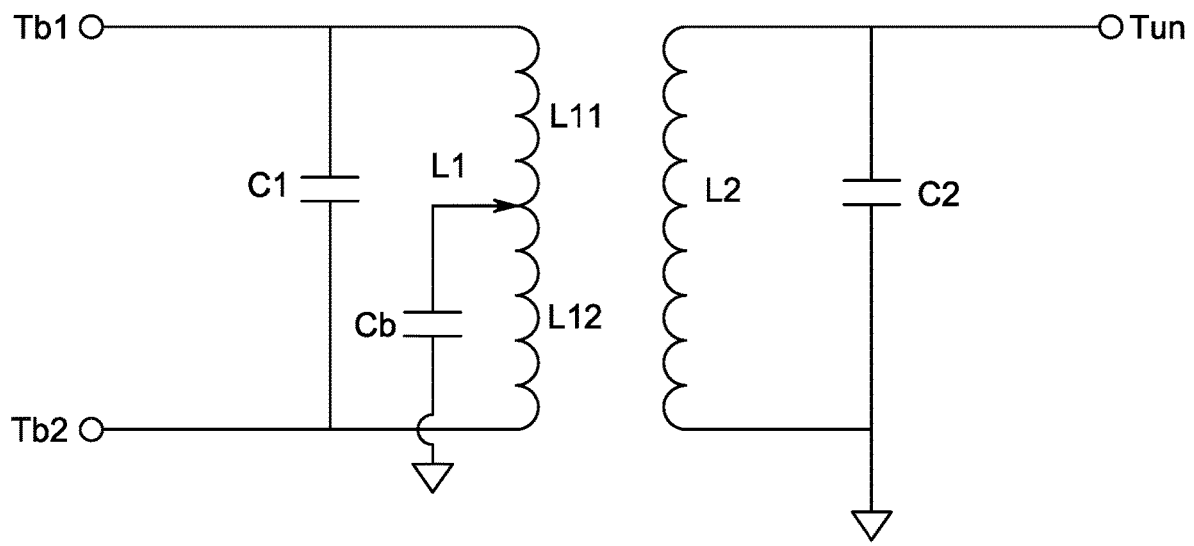
FIG. 4 is an equivalent circuit diagram of a balun in an embodiment of the present invention.

FIG. 4 shows an equivalent circuit diagram of the balun of this embodiment, wherein inductors L1 and L2 represent the first winding as shown in FIG. 2 and the second winding in FIG. 3 respectively. As shown in FIG. 4, by adjusting the position where a main balancing capacitor Cb (equivalent to both of the first main balancing capacitor Cb1 and the second main balancing capacitor Cb2 in FIG. 2) is connected to the first winding L1, the position of the virtual ground of the first winding L1 can be adjusted, thus changing the proportion of which the first winding L1 is divided into two portions L11 and L12, thereby the unbalanced between the two balanced ends is regulated.

The balun in this embodiment is particularly suitable for, for example, a push-pull amplifier in an MR detection system. Due to the existence of, for example, the first balancing capacitor Cb1 shown in FIG. 2, when the balun of this embodiment is connected to an input stage or output stage of push-pull power amplifier in the way as shown in FIG. 1, an additional function of providing direct current power supply (i.e., Vgs1 and Vgs2 or Vdd1 and Vdd2 in FIG. 1) for a transistor may be achieved via the first winding simultaneously. Specifically, a direct current voltage can be applied to an outer center tap of the first winding shown in FIG. 2, and the direct current voltage provides the direct current power supply Vgs1 and Vgs2 or Vdd1 and Vdd2 in FIG. 1 for a transistor at the first balanced end Tb1 and the second balanced end Tb2 via the first winding.

More specifically, when the balun of this embodiment serves as the input balun 1 (the second winding as a primary coil and the first winding as a secondary coil) in FIG. 1, a direct current voltage can be applied to an outer center tap of the first winding shown in FIG. 2, and the direct voltage at the first balanced end Tb1 and the second balanced end Tb2 is taken as gate-source voltages Vgs1 and Vgs2 in FIG. 1. Similarly, when the balun of this embodiment serves as the output balun 2 (the first winding as a primary coil and the second winding as a secondary coil) in FIG. 1, a direct current voltage can be applied to an outer center tap of the first winding shown in FIG. 2, and the direct voltage at the first balanced end Tb1 and the second balanced end Tb2 is taken as drain voltages Vgs1 and Vgs2 in FIG. 1.

By virtue of the structures described with reference to FIGS. 2 to 4, the present invention uses a multi-layer circuit board to implement a planar balun, therefore a ferrite magnetic core structure and coaxial transmission line wiring structure are avoided, which thus facilitates being used in a strong magnetic environment such as a scan room of an MR detection system. In addition, since balancing capacitors are used to set the position of the virtual ground of the first winding, the balance of the balun can be regulated. When the balun is applied in, for example, the push-pull circuit shown in FIG. 1, it can also provide direct current power supply for a transistor in the circuit.

Figure 5:
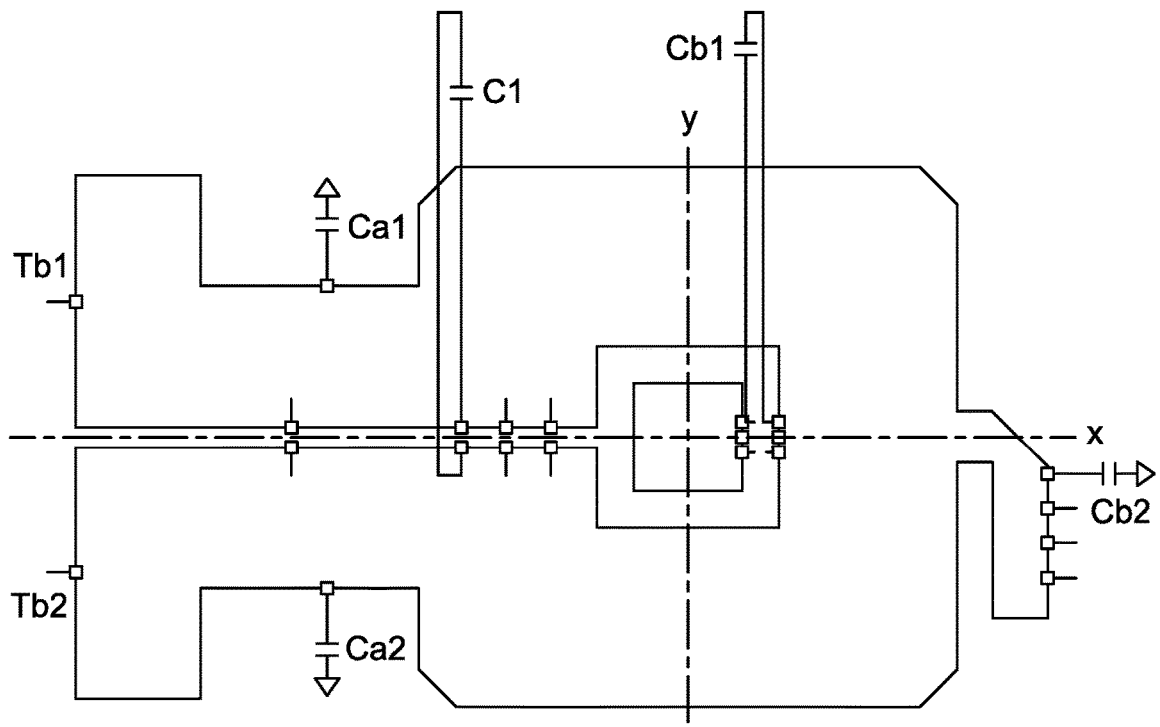
FIG. 5 is a planar schematic diagram of a first winding and relevant components of a balun in a preferred embodiment.

In one preferred embodiment, a regulating capacitor may be connected between the first lead and the second lead of the first winding and the ground potential in FIG. 2 to further regulate the balance of the balun. FIG. 5 shows the layout of the first winding and relevant components of this preferred embodiment. FIG. 5 differs from FIG. 2 in further comprising a first regulating capacitor Ca1 and a second regulating capacitor Ca2, wherein the first regulating capacitor Ca1 is connected between a portion near the first lead of the first winding and the ground potential, and the second regulating capacitor Ca2 is connected between a portion near the second lead of the first winding and the ground potential. By reasonably setting the capacitance values of the capacitors Ca1 and Ca2, the balance of the balun may be further improved.

Figure 6:
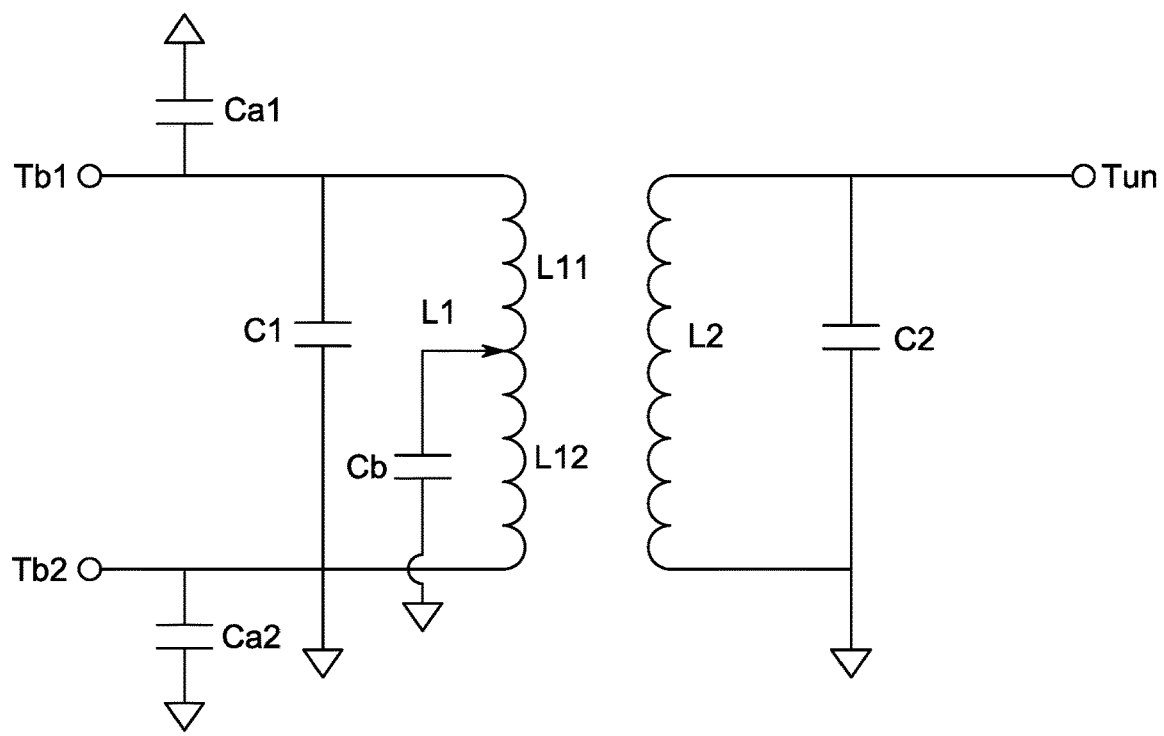
FIG. 6 is an equivalent circuit diagram of a balun in a preferred embodiment.

FIG. 6 shows an equivalent circuit diagram of the balun of this preferred embodiment, wherein inductors L1 and L2 represent the first winding as shown in FIG. 5 and the second winding in FIG. 3 respectively. As shown in FIG. 6, in addition to the fact that the position where the main balancing capacitor Cb (equivalent to both of the first main balancing capacitor Cb1 and the second main balancing capacitor Cb2 in FIG. 5) similar to FIG. 4 is connected to the first winding can be adjusted, the capacitance values of the regulating capacitors Ca1 and Ca2 may also be reasonably set to further improve the balance of the balun.

Optionally, in order to shield the interference from surrounding circuit components, a grounding welding pad which matches the outer contour of the winding can be provided at the periphery of the first winding and the second winding. As examples, FIGS. 7 and 8 respectively show a first winding and a second winding with peripheral grounding welding pads, which have components and connection relationships corresponding to FIG. 5 and FIG. 3 respectively, which is not described repeatedly herein. The arrangement of the peripheral grounding welding pad does not only facilitate shielding the interference from surrounding circuit components, but also conveniently grounds relevant components of the conductive layer where the corresponding winding is located which can be seen from FIGS. 7 and 8.

Figure 7:
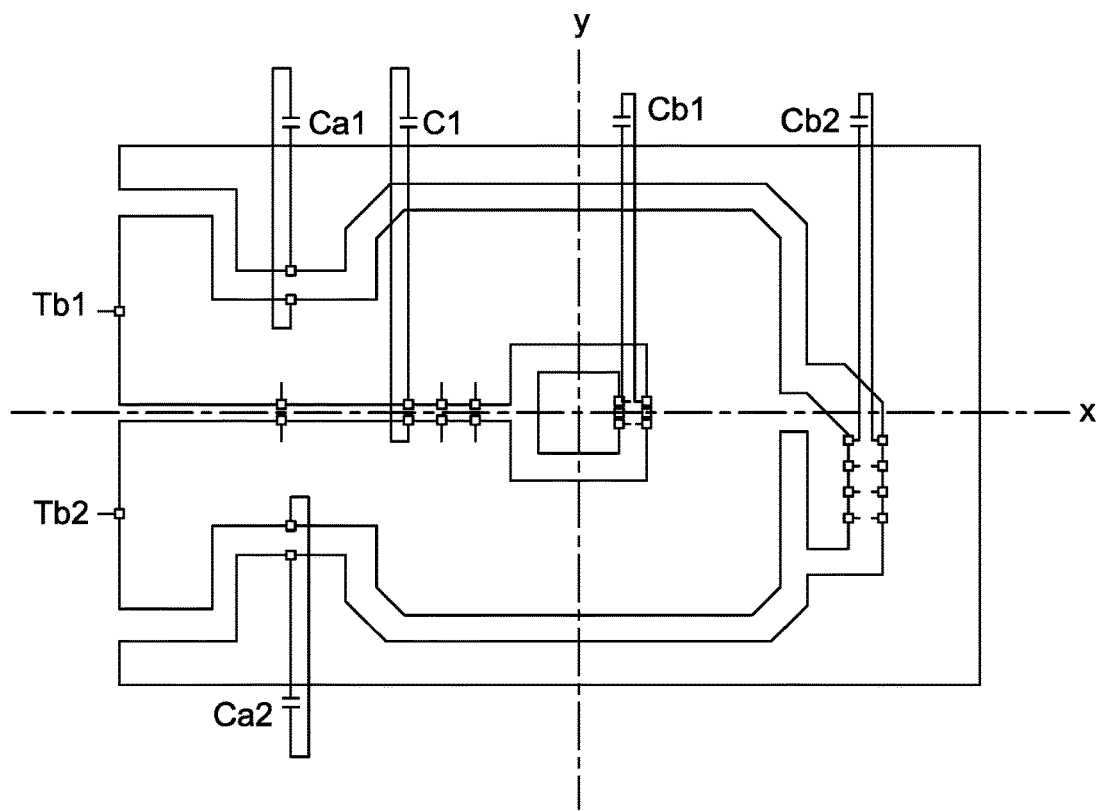
FIG. 7 is a planar schematic diagram of a first winding and relevant components with a peripheral grounding welding pad.
Figure 8:
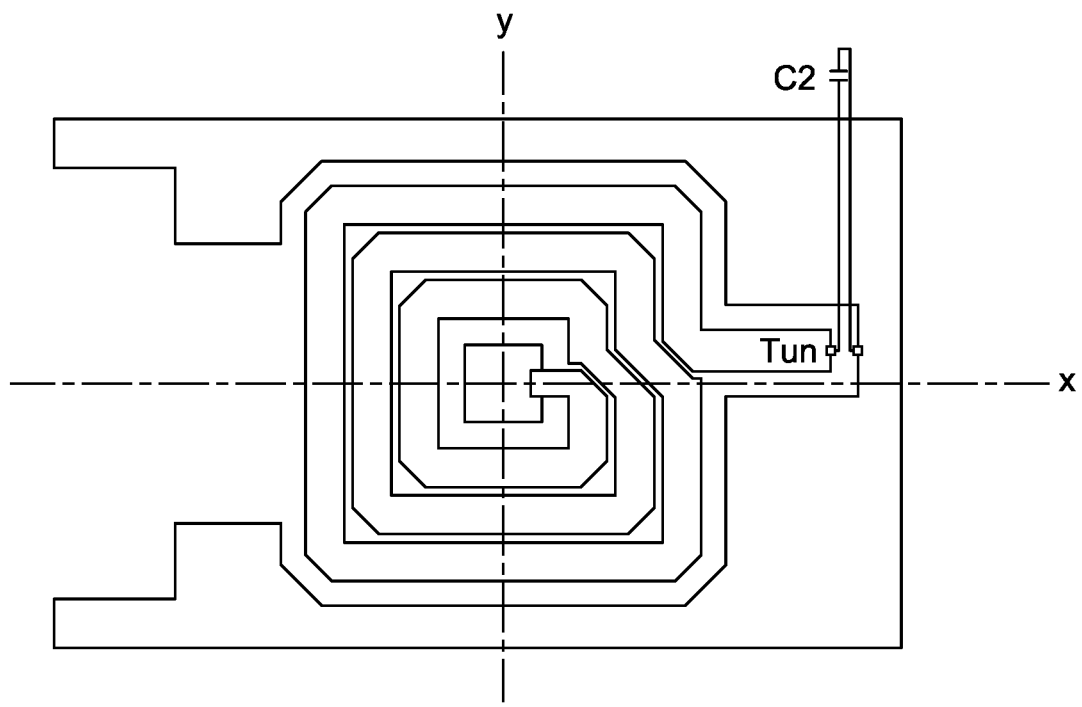
FIG. 8 is a planar schematic diagram of a second winding and relevant components with a peripheral grounding welding pad.
Figure 9:
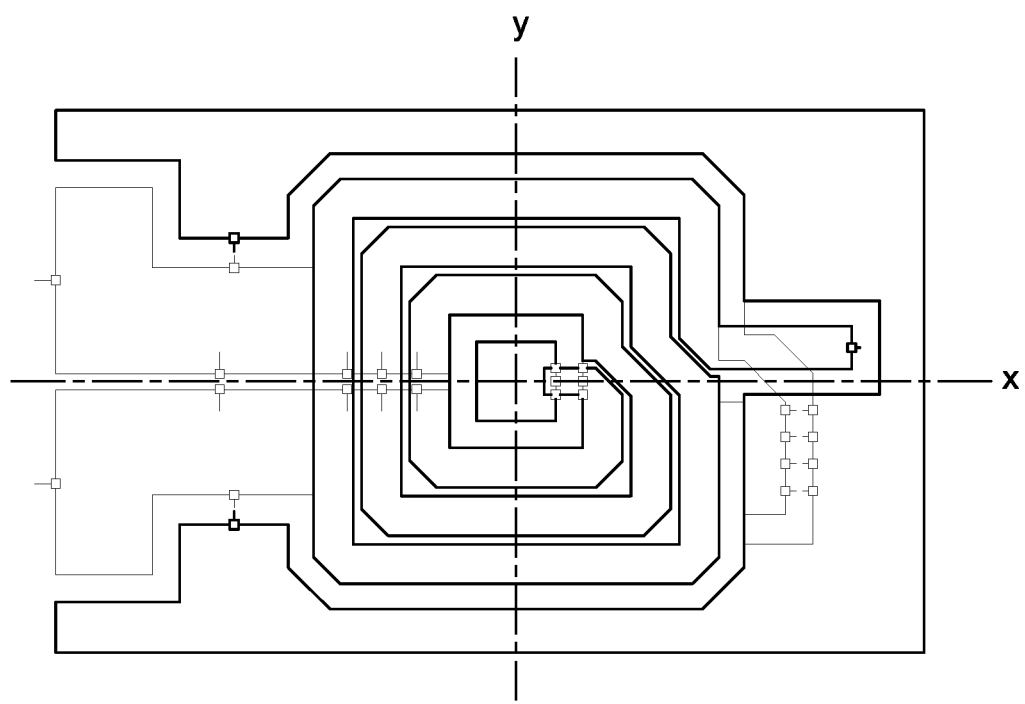
FIG. 9 is a schematic diagram of the overall layout of the first winding and the second winding.

FIG. 9 shows an example of the overall layout of the first winding and the second winding, wherein the shaded portion represents, for example, the first winding and grounding welding pad in FIG. 7, and the hollow-shot portion represents, for example, the second winding and grounding welding pad in FIG. 8. Preferably, as shown in FIG. 9, the first winding and the second winding are formed at corresponding positions of the first conductive layer and the second conductive layer, and overlapped with each other. Such a layout facilitates enhancing the coupling between the first winding and the second winding, and facilitates the balance of the balun. In addition, preferably, the first lead and the second lead of the first winding are oriented in a first direction, and the fourth lead of the second winding is oriented in a second direction which is opposite to the first direction. Such a layout facilitates the balance of the balun, and can space the input and output of the balun, so as to avoid the interference between the input and output.

In one preferred embodiment, the balun formed on a multi-layer circuit board may further comprise a metal ground serving as the ground potential, which is formed in a third conductive layer separated from the first conductive layer of the first winding and the second conductive layer of the second winding.

As an example, the first conductive layer and the second conductive layer can be spaced by a first insulating layer and a second insulating layer, and the third conductive layer with the formed metal ground can be located between the first insulating layer and the second insulating layer. That is, the multi-circuit board on which the balun is formed can comprise the first conductive layer, the first insulating layer, the third conductive layer, the second insulating layer and the second conductive layer in sequence from top to bottom (or from bottom to top).

Figure 10:
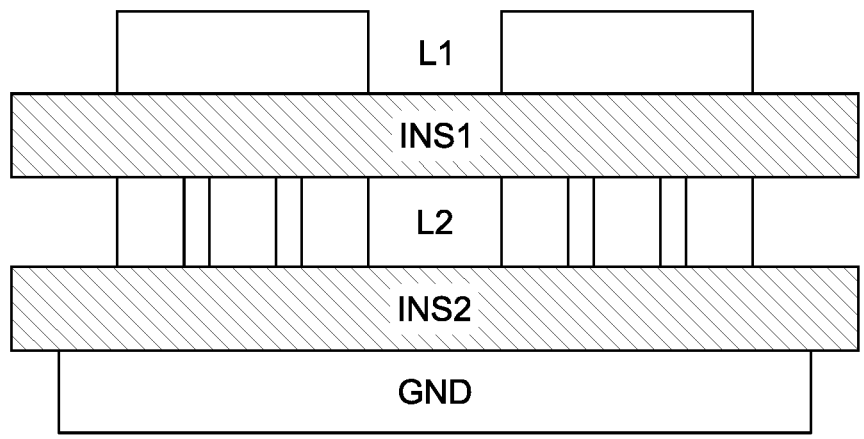
FIG. 10 schematically shows a first exemplary layer structure of a balun with a metal ground.
Figure 11:
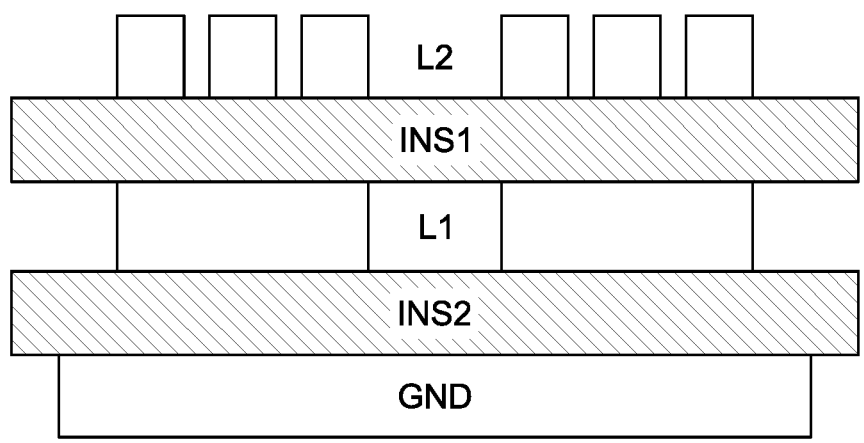
FIG. 11 schematically shows a second exemplary layer structure of a balun with a metal ground.

For another example, the first conductive layer and the second conductive layer can be spaced by a first insulating layer, and the third conductive layer with the formed metal ground can be formed as in a layer separated from the first conductive layer or the second conductive layer by at least a second insulating layer. FIGS. 10 and 11 schematically show an exemplary layer structure of a balun with such a structure.

In a first exemplary structure of FIG. 10, the multi-layer circuit board comprises a first conductive layer where a first winding L1 is located, a first insulating layer INS1, a second conductive layer where a second winding L2 is located, a second insulating layer INS2, and a third conductive layer which is separated from the second conductive layer by the second insulating layer INS2 in sequence from top to bottom, where a metal ground GND is formed in the third conductive layer. FIG. 11 shows another exemplary structure, which differs from FIG. 10 in that the position of the third conductive layer where the metal ground GND is located is different. That is, in a second example of FIG. 11, the third conductive layer where the metal ground GND is located is separated from the first conductive layer where the first winding L1 is located (not the second conductive layer where the second winding L2 is located) by the second insulating layer INS2.

Note that for the simplicity of the drawings, in the conductive layers of FIGS. 10 and 11, the single-turn first winding L1, the three-turn second winding L2 and the metal ground GND are merely schematically shown, while the central or peripheral grounding welding pad in FIGS. 2, 3, 5, 7 and 8 is not shown. It will be appreciated that the balun in this example may have the central and/or peripheral grounding welding pad described previously with reference to FIGS. 2, 3, 5, 7 and 8, which can be located at the center and/or periphery of the first winding L1 and second winding L2 layout, and connected to the metal ground GND via a conductive via.

Preferably, as shown in FIGS. 10 and 11, the coverage area of the metal ground is larger than or equal to respective coverage areas of the first winding L1 and the second winding L2. By virtue of such a structure, when the balun of this example is mounted with other circuit portions in an overlapped manner, the metal ground can serve as a shielding layer to enable the balun to avoid the interference from the other circuit portions. Therefore, the balun in this example facilitates being integrated with different circuit components and reducing the circuit size.

For example, when the balun is mounted to a water cooling board for heat dissipation, generally a groove needs to be opened on the water cooling board to avoid the balun position, thereby avoiding the electro-magnetic interference between the metal water cooling board and the balun. However, by utilizing the present embodiment, the balun having the metal ground shown in FIGS. 10 and 11 can be directly mounted above the water cooling board without the need to open a groove on the water cooling board, and is free from electro-magnetic interference by virtue of the shielding effect of the metal ground.

Figure 12:
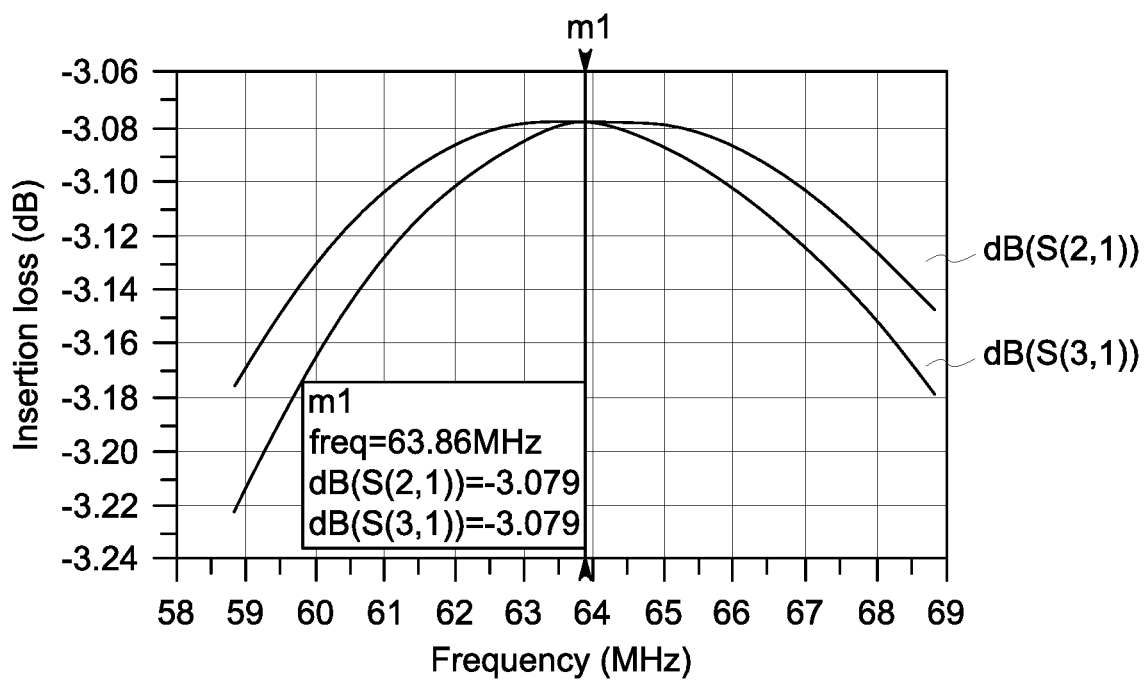
FIGS. 12 to 17 show simulation results of a preferred embodiment of the present invention.
Figure 13:
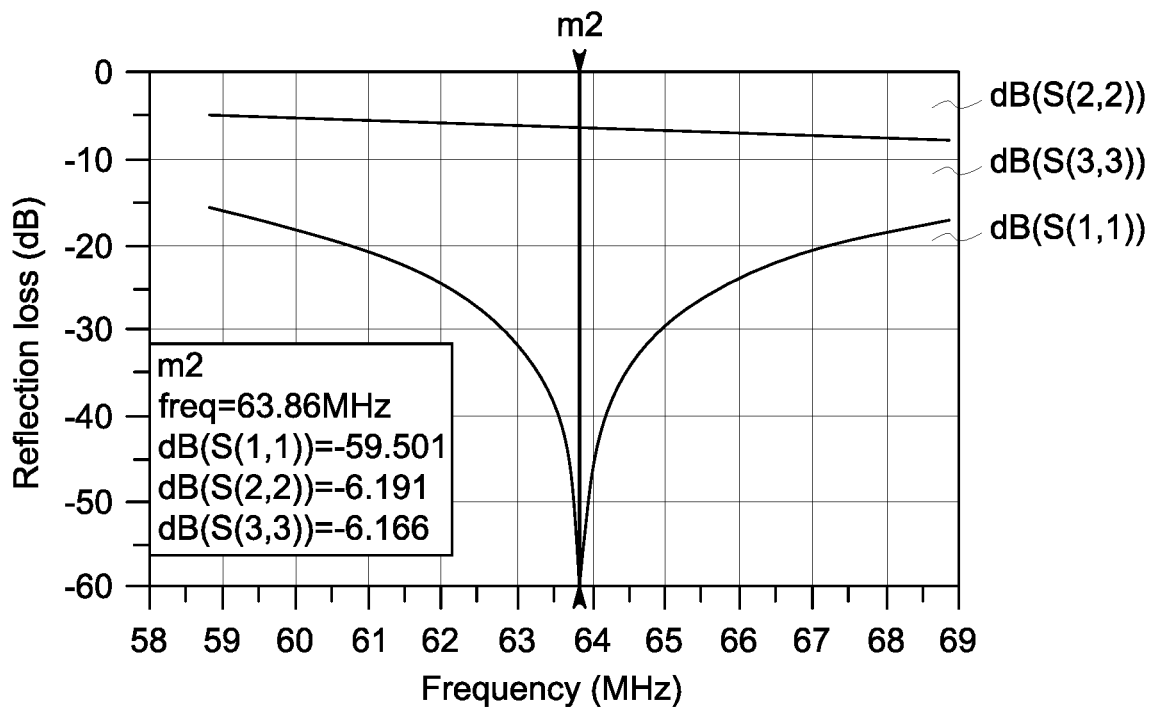
Figure 14:
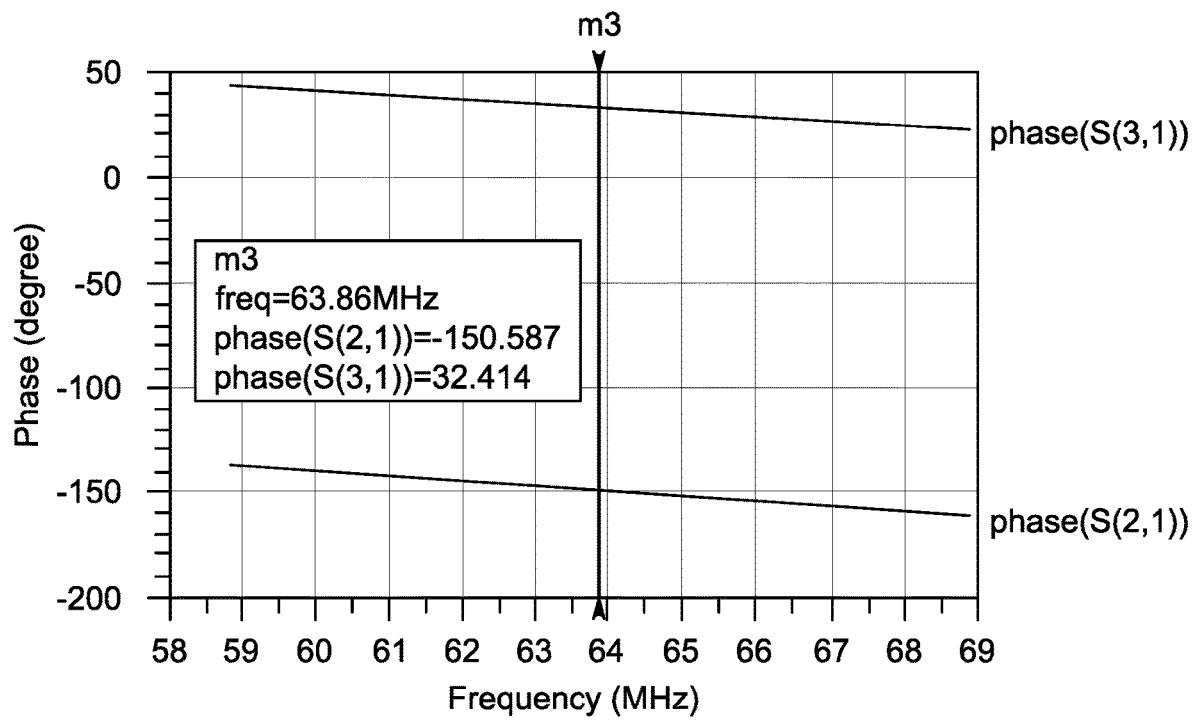
Figure 15:
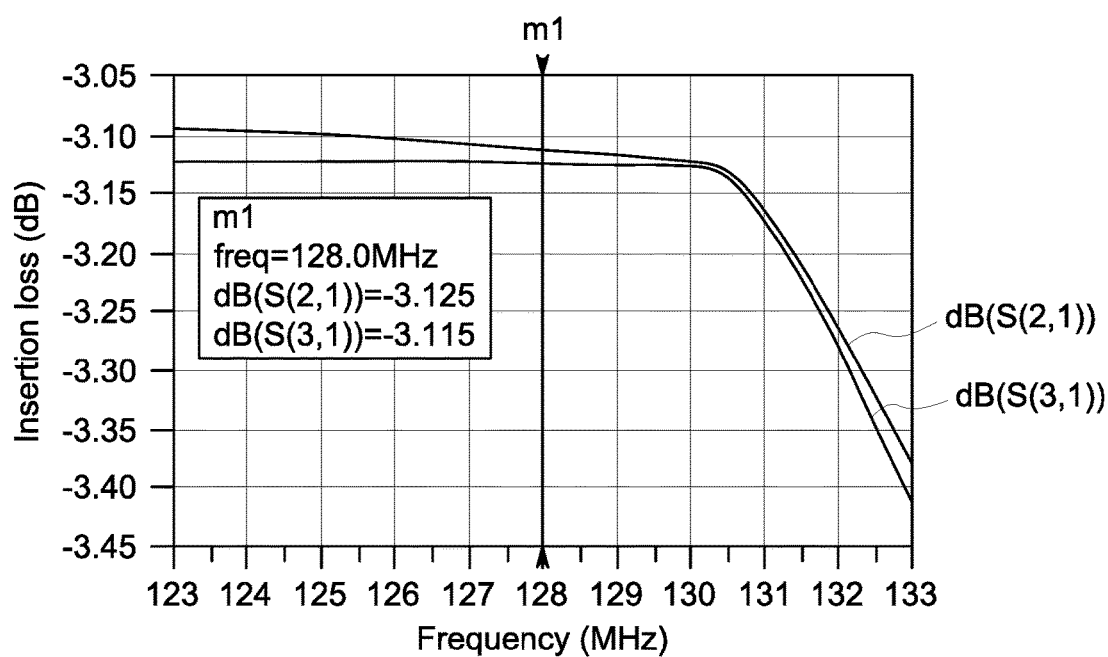
Figure 16:
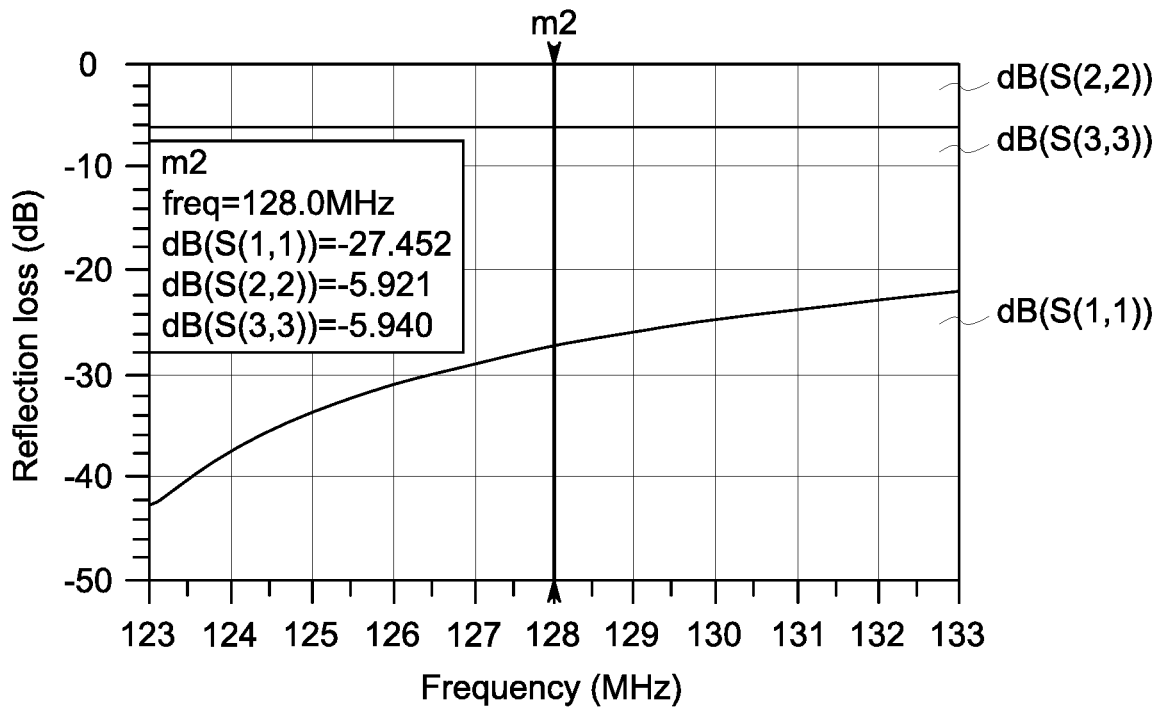
Figure 17:
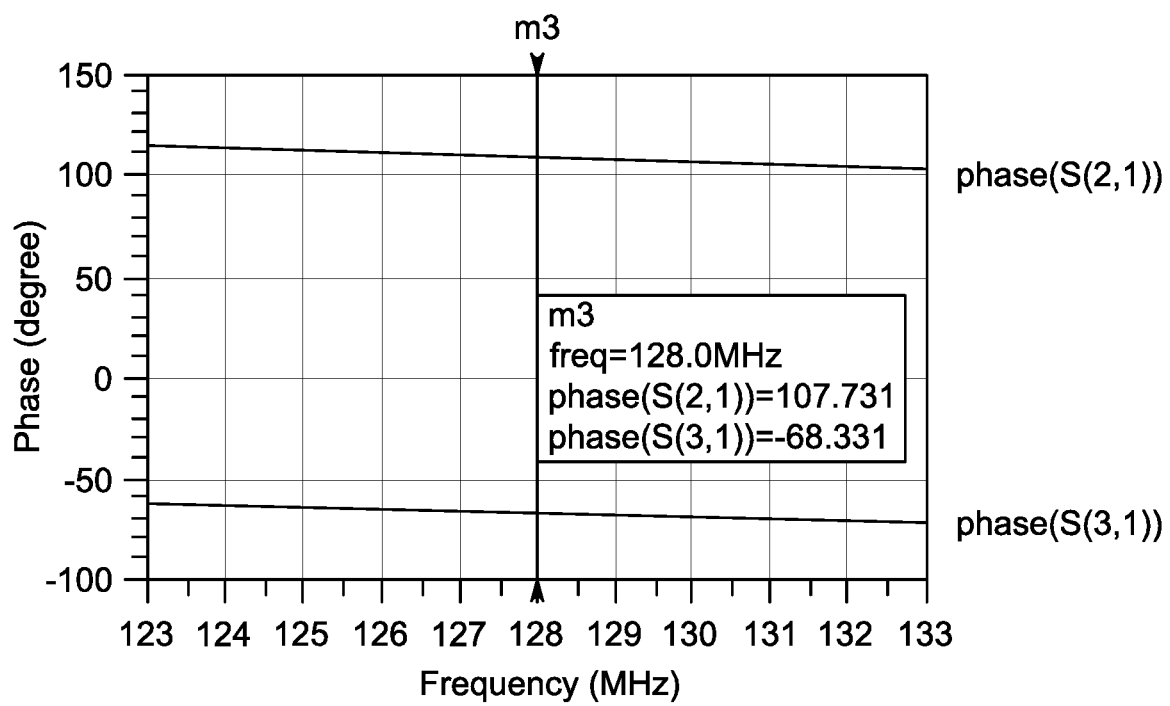

FIGS. 12 to 17 show simulation results of one preferred embodiment of the present invention. The preferred embodiment can have the circuit structure described previously, for example, with reference to FIGS. 3, 5 and 6. In these figures, FIGS. 12 to 14 show a simulation result with regard to a operational frequency of 63.86 MHz, and FIGS. 15 to 17 show a simulation result with regard to a operational frequency of 128 MHz.

With regard to the operational frequency of 63.86 MHz, FIG. 12 shows the insertion loss of the balun. The horizontal axis is frequency and the vertical axis is insertion loss, where dB (s(2, 1)) and dB (s(3, 1)) respectively represent the insertion loss from the first balanced end Tb1 to the unbalanced end Tun of the balun and the insertion loss from the second balanced end Tb2 to the unbalanced end Tun of the balun in, for example, FIG. 6. It can be seen from the figure that in the operational frequency of 63.86 MHz (i.e., a mark m1), the two insertion losses are equal and both are close to −3 dB, which represents that the entire balun insertion loss is very small, and the amplitude in the operational frequency of 63.86 MHz is balanced.

FIG. 13 shows the insertion loss of the balun. The horizontal axis is frequency and the vertical axis is reflection loss, where dB (s(1, 1)), dB (s(2, 2)) and dB (s(3, 3)) respectively represent the reflection loss from the unbalanced end Tun to the unbalanced end Tun of the balun, the reflection loss from the first balanced end Tb1 to the first balanced end Tb1 of the balun, and the reflection loss from the second balanced end Tb2 to the second balanced end Tb2 of the balun in, for example, FIG. 6. It can be seen from the figure that the respective reflection losses dB (s(2, 2)) and dB (s(3, 3)) of the two balanced ends are substantially coincided, i.e., substantially equal. In the operational frequency of 63.86 MHz (i.e., at a mark m2), the two reflection losses are both small and close to −6 dB, while the reflection loss of the unbalanced end is even close to −59 dB.

FIG. 14 shows the phase balanced conditions of the balun. The horizontal axis is frequency and the vertical axis is phase difference, where phase (s(2, 1)) and phase (s(3, 1)) respectively represent the phase difference between the first balanced end Tb1 and the unbalanced end Tun of the balun and the phase difference between the second balanced end Tb2 and the unbalanced end Tun of the balun in, for example, FIG. 6. It can be seen from the figure that in the operational frequency of 63.86 MHz (i.e., a mark m3), the difference between the two-phase differences is close to 180 degrees, thereby phase balancing is well achieved.

Similarly, with regard to the operational frequency of 128 MHz, FIG. 15 shows the insertion loss of the balun. The horizontal axis is frequency and the vertical axis is insertion loss, where dB (s(2, 1)) and dB (s(3, 1)) respectively represent the insertion loss from the first balanced end Tb1 to the unbalanced end Tun of the balun and the insertion loss from the second balanced end Tb2 to the unbalanced end Tun in, for example, FIG. 6. It can be seen from the figure that in the operational frequency of 128 MHz (i.e., a mark m1), the two insertion losses are equal and both are close to −3 dB, which represents the entire balun insertion loss is very small, and the amplitude in the operational frequency of 128 MHz is balanced.

FIG. 16 shows the insertion loss of the balun. The horizontal axis is frequency and the vertical axis is reflection loss, where dB (s(1, 1)), dB (s(2, 2)) and dB (s(3, 3)) respectively represent the reflection loss from the unbalanced end Tun to the unbalanced end Tun of the balun, the reflection loss from the first balanced end Tb1 to the first balanced end Tb1 of the balun, and the reflection loss from the second balanced end Tb2 to the second balanced end Tb2 of the balun in, for example, FIG. 6. It can be seen from the figure that the respective reflection losses dB (s(2, 2)) and dB (s(3, 3)) of the two balanced ends are substantially coincided, i.e., substantially equal. In the operational frequency of 128 MHz (i.e., at the mark m2), the two reflection losses are both small and close to −6 dB, while the reflection loss of the unbalanced end is even near −27 dB.

FIG. 17 shows the phase balanced conditions of the balun. The horizontal axis is frequency and the vertical axis is phase difference, where phase (s(2, 1)) and phase (s(3, 1)) respectively represent the phase difference between the first balanced end Tb1 and the unbalanced end Tun of the balun and the phase difference between the second balanced end Tb2 and the unbalanced end Tun of the balun in, for example, FIG. 6. It can be seen from the figure that in the operational frequency of 128 MHz (i.e., a mark m3), the difference between the two-phase differences is close to 180 degrees, thereby phase balancing is well achieved.

It can be seen from the simulation results from FIGS. 12 to 17 that the balun in the embodiments of the present invention has a good amplitude balance and phase balance in different operational frequencies.

According to another aspect of the present invention, a multi-layer circuit board is provided, on which the planar balun described above with reference to FIGS. 1 to 17 is formed. The multi-layer circuit board can have various characteristics and advantages of the planar balun described above and this is not described repeatedly herein.

Some exemplary embodiments have been described in the above. However, it should be understood that various modifications may be made thereto. For example, if the described techniques are carried out in different orders, and/or if the components in the described system, architecture, apparatus or circuit are combined in different ways and/or replaced or supplemented by additional components or equivalents thereof, proper results may still be achieved. Accordingly, other implementation also falls within a protection range of the claims.

What is claimed is:
1. A planar balun formed on a multi-layer circuit board, comprising:
   a first winding with at least one turn, which is formed in a first conductive layer, and has a first lead and a second lead serving as a first balanced end and a second balanced end of the balun respectively;
   a first peripheral grounding pad formed at a periphery of the first winding, the first peripheral grounding pad matching an outer contour of the first winding;
   a second winding with at least one turn, which is formed in a second conductive layer separated from the first conductive layer by at least a first insulating layer, and has a third lead and a fourth lead, wherein the third lead is connected to a ground potential, and the fourth lead serves as an unbalanced end of the balun;
   a second peripheral grounding pad formed at a periphery of the second winding, the second peripheral grounding pad matching an outer contour of the second winding; and a first balancing capacitor, which is connected between a selected portion near a center of the first winding and the ground potential.

2. The planar balun of claim 1, wherein the selected portion is determined from a plurality of candidate portions near the center of the first winding according to an operational frequency of the balun.

3. The planar balun of claim 1, further comprising:
a first regulating capacitor, which is connected between a portion near the first lead of the first winding and the ground potential; and
a second regulating capacitor, which is connected between a portion near the second lead of the first winding and the ground potential.

4. The planar balun of claim 1, further comprising a first tuning capacitor, which is connected between the first lead and the second lead.

5. The planar balun of claim 1, further comprising a second tuning capacitor, which is connected between the fourth lead and the ground potential.

6. The planar balun of claim 1, wherein the first winding and the second winding are formed at corresponding positions of the first conductive layer and the second conductive layer, and overlapped with each other.

7. The planar balun of claim 1, wherein the first lead and the second lead are oriented in a first direction, and the fourth lead is oriented in a second direction which is opposite to the first direction.

8. The planar balun of claim 1, further comprising a metal ground serving as the ground potential, which is formed in a third conductive layer separated from the second conductive layer by at least a second insulating layer.

9. The planar balun of claim 1, further comprising a metal ground serving as the ground potential, which is formed in a third conductive layer separated from the first conductive layer by at least a second insulating layer.

10. The planar balun of claim 8, wherein a coverage area of the metal ground is greater than or equal to respective coverage areas of the first winding and the second winding.

11. The planar balun of claim 1, wherein the first winding is a single-turn winding.

12. The planar balun of claim 11, wherein the second winding is a multi-turn winding, with a terminal of the innermost turn of the second winding being connected to the third lead, and a terminal of the outermost turn of the second winding being connected to the fourth lead.

13. The planar balun of claim 12, wherein the first balancing capacitor is connected between a selected portion near an inner center of the single-turn winding and the ground potential, and there is a center tap at an outer center of the single-turn winding, the center tap being connected to the ground potential via the second balancing capacitor.

* * * * *